United States Patent
Chanda et al.

(10) Patent No.: US 7,683,651 B2
(45) Date of Patent: *Mar. 23, 2010

(54) TEST STRUCTURE FOR ELECTROMIGRATION ANALYSIS AND RELATED METHOD

(75) Inventors: Kaushik Chanda, Fishkill, NY (US); Ronald G. Filippi, Wappingers Falls, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/348,434

(22) Filed: Jan. 5, 2009

(65) Prior Publication Data

US 2009/0108855 A1    Apr. 30, 2009

Related U.S. Application Data

(63) Continuation of application No. 11/830,368, filed on Jul. 30, 2007, now Pat. No. 7,521,952.

(51) Int. Cl.
G01R 31/26 (2006.01)
G01R 19/00 (2006.01)
H01L 23/58 (2006.01)

(52) U.S. Cl. .......... 324/765; 324/715; 324/158.1; 438/17; 257/48

(58) Field of Classification Search .......... 324/754–765, 324/158.1; 438/14–18; 257/48
See application file for complete search history.

(56) References Cited

U.S. PATENT DOCUMENTS

| | | | |
|---|---|---|---|
| 4,652,812 A | 3/1987 | Gimpelson et al. | |
| 4,933,743 A | 6/1990 | Thomas et al. | |
| 5,264,377 A | 11/1993 | Chesire et al. | |
| 5,760,674 A | 6/1998 | Gilmour et al. | |
| 5,777,486 A | 7/1998 | Hsu | |
| 6,037,795 A | 3/2000 | Filippi et al. | |
| 6,202,191 B1 | 3/2001 | Filippi et al. | |
| 6,603,321 B2 | 8/2003 | Filippi, Jr. et al. | |
| 6,724,214 B2 | 4/2004 | Manna et al. | |
| 6,762,597 B1 * | 7/2004 | Hau-Riege et al. | 324/71.1 |
| 6,806,574 B2 | 10/2004 | Cho | |
| 6,897,476 B1 * | 5/2005 | Kim et al. | 257/48 |
| 6,995,392 B2 | 2/2006 | McLaughlin et al. | |
| 7,026,225 B1 * | 4/2006 | Hau-Riege et al. | 438/468 |
| 2008/0157075 A1 | 7/2008 | Feustel et al. | |

OTHER PUBLICATIONS

Lee et al., "Statistical Study for Electromigration Reliability in Dual-Damascene Cu Interconnects," IEEE Transactions on Device and Materials Reliability, vol. 4, No. 2, Jun. 2004, pp. 237-245.

* cited by examiner

*Primary Examiner*—Ha Tran T Nguyen
*Assistant Examiner*—Emily Y Chan
(74) *Attorney, Agent, or Firm*—Ian D. MacKinnon; Hoffman Warnick LLC

(57) ABSTRACT

A test structure for electromigration and related method are disclosed. The test structure may include an array of a plurality of multilink test sets, each multilink test set including a plurality of metal lines positioned within a dielectric material and connected in a serial configuration; each multilink test set being connected in a parallel configuration with the other multilink test sets, the parallel configuration including a first electrical connection to a cathode end of a first metal line in each multilink test set and a second electrical connection to an anode end of a last metal line in each multilink test set.

15 Claims, 5 Drawing Sheets

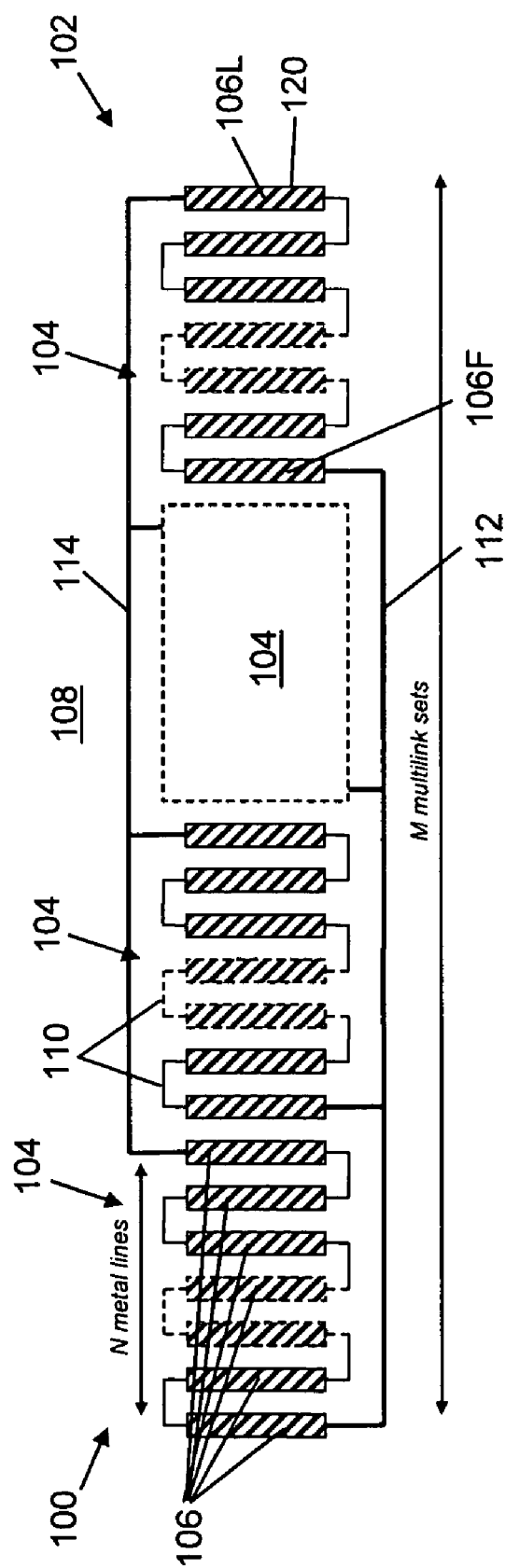
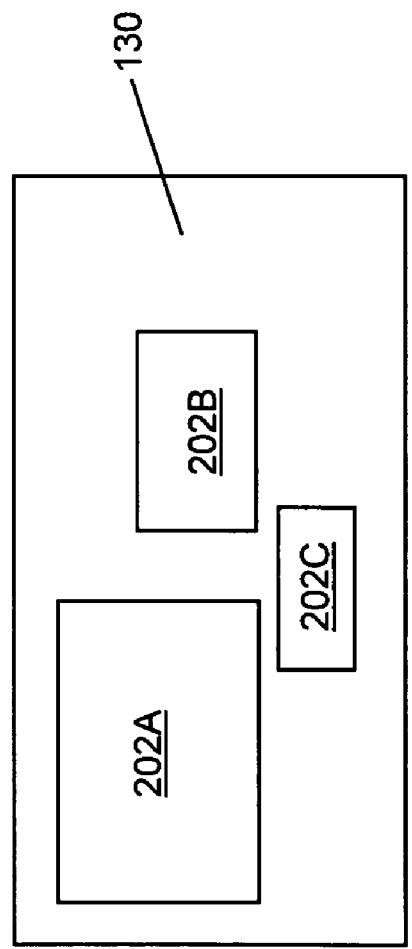
FIG. 1
FIG. 2

TEST STRUCTURE FOR ELECTROMIGRATION ANALYSIS AND RELATED METHOD

This application is a continuation patent application of U.S. patent application Ser. No. 11/830,368, filed on Jul. 30, 2007, now U.S. Pat. No. 7,521,952 currently allowed.

BACKGROUND

1. Technical Field

The disclosure relates generally to integrated circuit (IC) chip fabrication, and more particularly, to a test structure for electromigration analysis and a related method.

2. Background Art

Electromigration is a reliability concern for copper (Cu) interconnects, in which atoms migrate in the direction of the electron flow, eventually leading to void formation at the cathode end of a line and extrusion formation at the anode end of the line. That is, the electron flow is out of the cathode end and into the anode end of the line.

A dual damascene process is often used to fabricate copper interconnects, such that the vias and lines are formed in the same process step for cost improvements. In most cases, failure is caused by void formation in the vias or lines, and is detected as an increase in resistance of the structure. The failure times along with the corresponding cumulative distribution function (CDF) values are typically fitted to a lognormal failure distribution in order to determine the statistical parameters for the test structure such as median time to failure ($T_{50}$) and standard deviation (sigma ($\Box$)).

A large sample size is required to increase the level of confidence in the statistical parameters. In electromigration, different types of distributions like bimodal and three-parameter distribution, have been used to determine the interconnect reliability. These distributions require more parameters than the usual two and hence even larger sample size. As experiments are conducted under highly accelerated conditions, small errors in parameter estimation can lead to incorrect reliability projections at use conditions. However, sample sizes are limited by the available time and resources (ovens, packages, etc.).

SUMMARY

A test structure for electromigration and related method are disclosed. The test structure may include an array of a plurality of multilink test sets, each multilink test set including a plurality of metal lines positioned within a dielectric material and connected in a serial configuration; each multilink test set being connected in a parallel configuration with the other multilink test sets, the parallel configuration including a first electrical connection to a cathode end of a first metal line in each multilink test set and a second electrical connection to an anode end of a last metal line in each multilink test set.

A first aspect of the disclosure provides a test structure for electromigration analysis, the test structure comprising: an array of a plurality of multilink test sets, each multilink test set including a plurality of metal lines positioned within a dielectric material and connected in a serial configuration; and each multilink test set being connected in a parallel configuration with the other multilink test sets, the parallel configuration including a first electrical connection to a cathode end of a first metal line in each multilink test set and a second electrical connection to an anode end of a last metal line in each multilink test set.

A second aspect of the disclosure provides a method for electromigration stress testing, the method comprising: providing an array of a plurality of multilink test sets, each multilink test set including a plurality of metal lines positioned within a dielectric material and connected in a serial configuration, each multilink test set being connected in a parallel configuration with the other multilink test sets, the parallel configuration including a first electrical connection to a cathode end of a first metal line in each multilink test set and a second electrical connection to an anode end of a last metal line in each multilink test set; and stressing the metal lines and assuming a failure when a single metal line fails.

A third aspect of the disclosure provides a test structure for electromigration analysis, the test structure comprising: a plurality of arrays, each array including a plurality of multilink test sets, each multilink test set including a plurality of metal lines positioned within a dielectric material and connected in a serial configuration; each multilink test set being connected in a parallel configuration with the other multilink test sets, the parallel configuration including a first electrical connection to a cathode end of a first metal line in each multilink test set and a second electrical connection to an anode end of a last metal line in each multilink test set; and each array including N number of metal lines wired in the serial configuration in each multilink test set and M number of the multilink test sets connected in the parallel configuration, each array having a different M/N combination to allow failure data collection corresponding to different failure rate ranges.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows embodiments of a test structure according to the disclosure.

FIG. 2 shows a plurality of arrays having different M/N combinations according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 3:
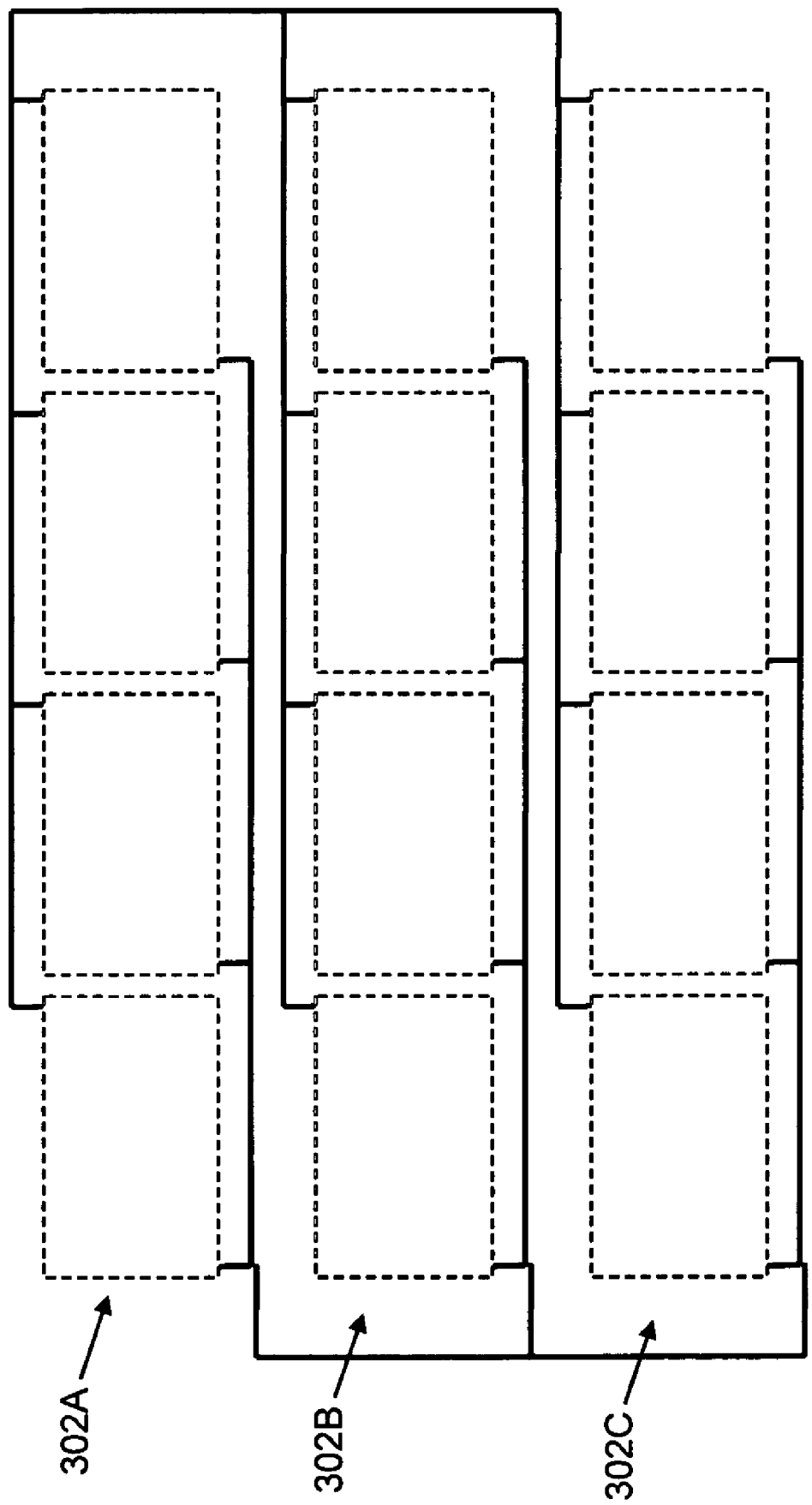
FIG. 3 shows a plurality of arrays arranged to include columns and rows of multilink test sets according to the disclosure.

Referring to FIG. 1, embodiments of a test structure 100 for electromigration analysis are illustrated. Test structure 100 includes an array 102 of a plurality of multilink test sets (or cells) 104. Each multilink test set 104 includes a plurality of metal lines (or links) 106 positioned within a dielectric material 108 and connected in a serial configuration, e.g., by one or more metal segments 110. Each metal line 106 represents a conventional interconnect line used in electromigration stresses. For example, each could be a 0.08 □m wide and 200 □m long first metal (M1) interconnect. The different metal lines 106 (at one level) are connected to each other through vias and metal segments 110 at the next level. Metal segments 110 (connectors) should be designed such that no electromigration occurs in them. One way of accomplishing this is to have short segments that exploit the Blech's short length effect.

Each multilink test set 104 is connected in a parallel configuration with other multilink test sets 104, e.g., by one or more electrical interconnections 112, 114. In one embodiment, the parallel configuration includes a first electrical connection 112 to a cathode end of a first metal line 106F in each multilink test set 104 and a second electrical connection 114 to an anode end of a last metal line 106L in each multilink test set 104. As indicated, array 102 includes N number of metal lines 106 wired in the serial configuration in each multilink test set 104 and M number of multilink test sets 104 connected in the parallel configuration.

Metal lines 106 include a material such as: aluminum (Al), copper (Cu), gold (Au) and/or silver (Ag), and alloys thereof. Dielectric material 108 may include, for example: silicon dioxide ($SiO_2$), hydrogenated silicon oxycarbide (SiCOH), porous SiCOH, silicon low dielectric constant material (SiLK), and/or a polyimide. A liner 120 for metal lines 106 may include, for example: titanium (Ti), titanium nitride (TiN), tantalum (Ta), tantalum nitride (TaN) and/or tungsten (W). The above-described materials are meant to be illustrative only and other materials for metal line 106, dielectric material 108 and liner 120 may be employed within the scope of the disclosure.

Figure 4:
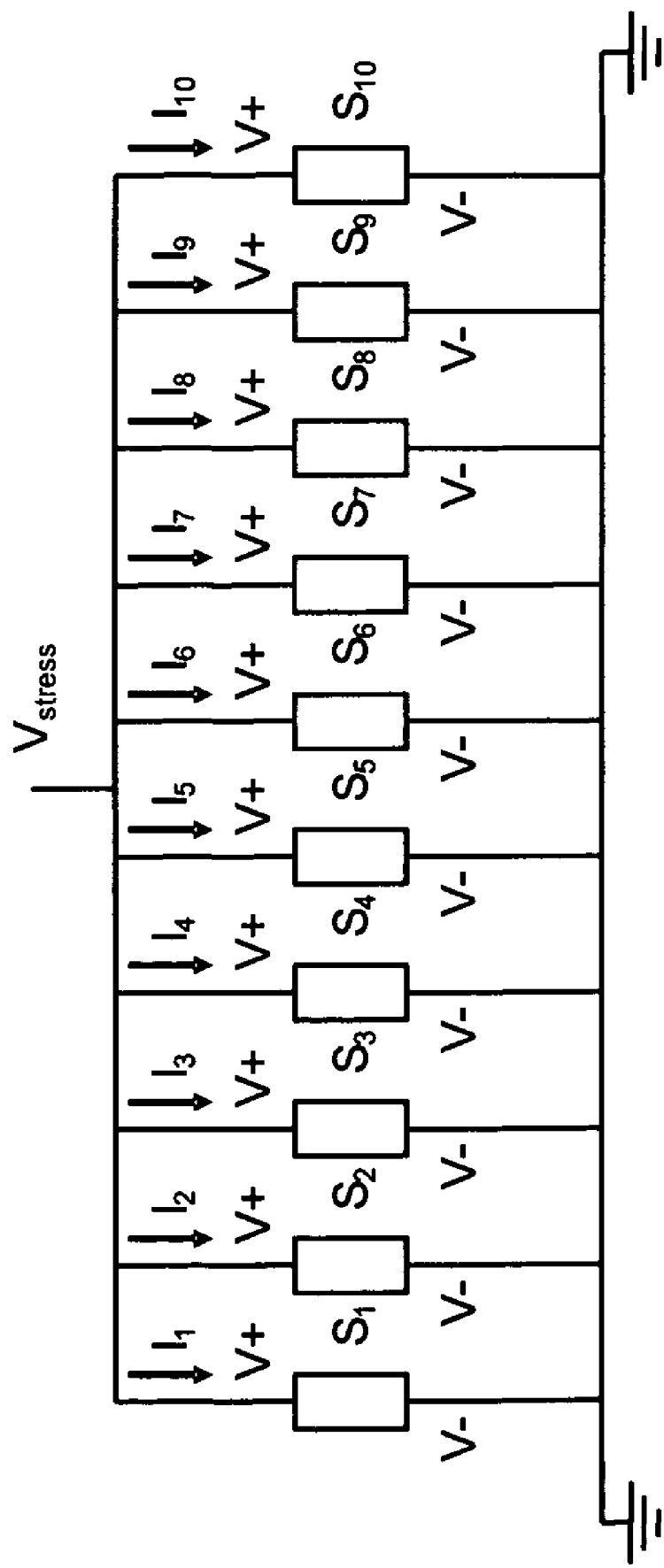
FIG. 4 shows a plurality of arrays arranged in a parallel manner.
Figure 5:
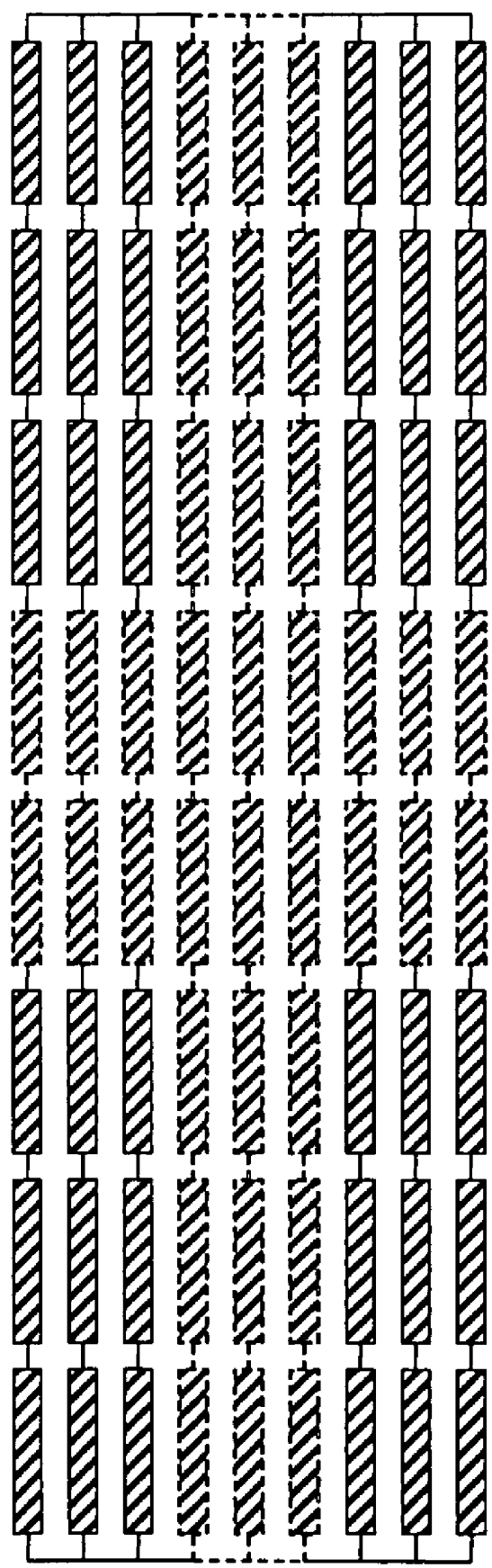
FIG. 5 shows an alternative configuration of multilink test sets according to the disclosure.

FIG. 2 shows a plurality of arrays 202A-C having different M/N combinations to allow failure data collection corresponding to different failure rate ranges. Plurality of arrays 202A-C may be positioned on the same macro 130. In one embodiment, each M/N combination may have N in the range 1 to 1000 and M in the range 1 to 1000. However, other ranges may also be employed. FIG. 3 shows a plurality of arrays 302A-C arranged to include columns and rows of multilink test sets 104, e.g., in a 3M×N arrangement. In one embodiment, a number of parallel arrangements for each M/N combination multilink test set is in the range 1 to 100. Higher values of 'M' and 'N' imply more structures that can simultaneously be stressed, as described elsewhere herein. As a result, the resolution of test structure 100 is increased. FIG. 4 shows an embodiment including a plurality of arrays S1-S10 arranged in parallel; each array may include a different M/N combination. FIG. 5 shows an alternative configuration, which occupies a large chip area, and is not as efficient as that of FIG. 1.

The disclosure also includes a method for electromigration stress testing. In this embodiment, an array of a plurality of multilink test sets 104, as described above, are provided using any now known or later developed technique. In one embodiment, a dual damascene process is employed. Array(s) 102, 202A-C, 302A-C may be provided with N number of metal lines 106 wired in the serial configuration in each multilink test set 104 and M number of the multilink test sets 104 connected in the parallel configuration. A plurality of arrays 102, 202A-C, 302A-C may be provided having different M/N combinations to allow failure data collection corresponding to different failure rate ranges.

The method of electromigration analysis also includes stressing metal lines 106 and assuming a failure occurs when any one of the single metal lines 106 fails. The stressing may be monitored to obtain a data set including failure times on a set of multilink test sets 104. In one embodiment, the stressing may include stressing each array 202A-C, 302A-C separately and detecting electromigration failure using, e.g., four-point probe resistance measurements. The method may also include converting cumulative distribution function (CDF) values of each array 102, 202A-C, 302A-C to a corresponding CDF value of a single metal line 106. This conversion may be carried out, for example, by testing a multilink test set 104. A multilink test set survives until any one of the links comprising the test set fails. This is called the weakest-link behavior. In case of N links in series and M links in parallel, the CDF of a single link ($F_1$) is related to the CDF of the multilink test set ($F_{MN}$) by the following equation: $F_1 = 1 - \{1 - (F_{MN}/M)\}^{1/N}$. In this manner, instead of stressing a number of individual links (as is typically done), a number of multilink test sets are stressed and the above equation is used to derive the CDF of a single link. Single link CDF $F_1$ is much lower than array CDF $F_{MN}$ (for M=1, N=50 and $F_{MN}$=0.01, $F_1$=0.0021). Since the failure times of both are the same (the multilink fails when any of the single links (metal lines) fails), a lognormal distribution of the single link and hence the statistical parameters can be obtained. In particular, the CDF values and failure times of the array(s) 102, 202A-C, 302A-C may be fit to a failure distribution to determine the statistical parameters of a single metal line. In one embodiment, the failure distribution may be a lognormal failure distribution.

Figure 6:
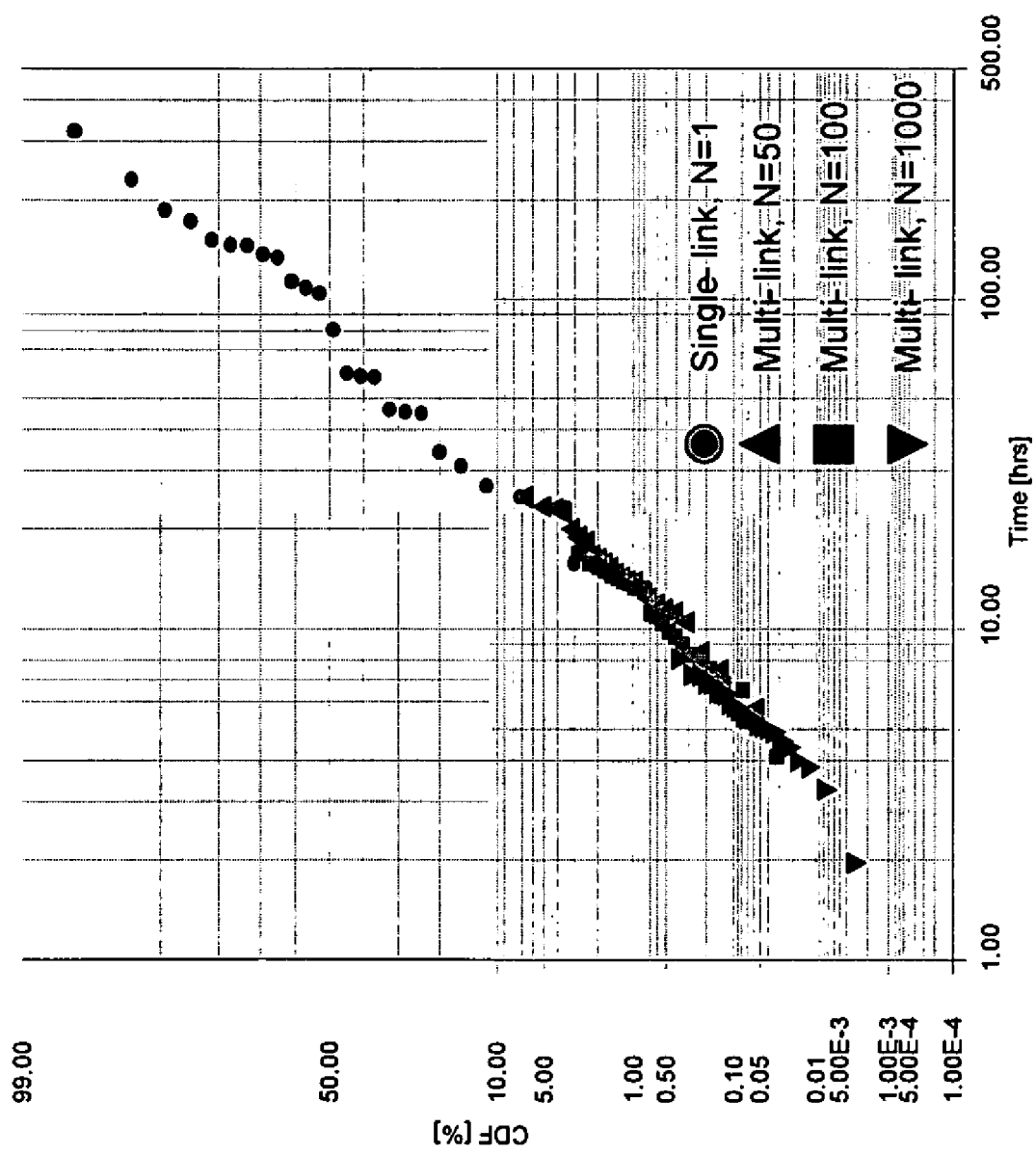
FIG. 6 shows a representative graph illustrating converting cumulative distribution function (CDF) values of an array(s) to a corresponding CDF value of a single metal line.

Based on the above-described method, the failure time (T50) and a standard deviation (sigma ($\sigma$)) may be determined for a single metal line 106 using any now known or later developed technique. To illustrate, FIG. 6 shows a representative graph illustrating converting cumulative distribution function (CDF) values of an array(s) to a corresponding CDF value of a single metal line. In particular, FIG. 6 shows an example graph of the conversion from array failure time $F_{MN}$ to single link failure time $F_1$ with M=1 and the number of links N ranging from 1 to 1000, where the failure times are generated for a lognormal distribution using Monte-Carlo simulation. As can be seen, the conversion combines the four independent lognormal distributions into one single lognormal distribution. The combined lognormal distribution covers wide ranges of CDF values and failure times, and thus yields significantly improved confidence level in the statistical parameters needed for reliability modeling and lifetime projection. The more M and N numbers, the greater the resolution. In addition, the use of a series-parallel configuration allows for reduction of the total resistance of test structure 100, and the amount of current necessary if a constant current stress system is employed. Further, for a given resistance shift ($\Delta R$) and resistance R, the series/parallel arrangement needs to measure (M/N)($\Delta R/R$). If it is a series only structure, the test system will need to measure (1/N)(□R/R). By combining M such series in parallel, the signal is advantageously enhanced by M times or (M/N)($\Delta R/R$).

The test structure as described above is part of the design for an IC chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The test structure and method as described above are used in the fabrication of integrated circuit chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A test structure for electromigration analysis, the test structure comprising:
    a plurality of arrays, each array including a plurality of multilink test sets, each multilink test set including a plurality of metal lines positioned within a dielectric material and connected in a serial configuration, wherein each array includes N number of metal lines wired in the serial configuration in each multilink test set and M number of the multilink test sets connected in the parallel configuration, and each array having different M/N combinations to allow failure data collection corresponding to different failure rate ranges, and wherein a number of parallel arrangements for each M/N combination multilink test structure is in the range 1 to 100; and
    each multilink test set being connected in a parallel configuration with the other multilink test sets, the parallel configuration including a first electrical connection to a cathode end of a first metal line in each multilink test set and a second electrical connection to an anode end of a last metal line in each multilink test set.

2. The test structure of claim 1, wherein a plurality of arrays are positioned on a same macro.

3. The test structure of claim 1, wherein for each M/N combination, N is in the range 1 to 1000 and M is in the range 1 to 1000.

4. The test structure of claim 1, wherein the array is arranged to include columns and rows of multilink test sets.

5. The test structure of claim 1, wherein the metal line includes a material selected from the group consisting of: aluminum (Al), copper (Cu), gold (Au), silver (Ag), and an alloy thereof.

6. The test structure of claim 1, wherein the dielectric material is selected from the group consisting of: silicon dioxide ($SiO_2$), hydrogenated silicon oxycarbide (SiCOH), porous SiCOH, silicon low dielectric constant material (SiLK), and a polyimide.

7. The test structure of claim 1, further comprising a liner for the metal lines, wherein the liner material is selected from the group consisting of: titanium (Ti), titanium nitride (TiN), tantalum (Ta), tantalum nitride (TaN) and tungsten (W).

8. A method for electromigration stress testing, the method comprising:
    providing an array of a plurality of multilink test sets, each multilink test set including a plurality of metal lines positioned within a dielectric material and connected in a serial configuration, each multilink test set being connected in a parallel configuration with the other multilink test sets, the parallel configuration including a first electrical connection to a cathode end of a first metal line in each multilink test set and a second electrical connection to an anode end of a last metal line in each multilink test set; wherein the providing includes providing a plurality of arrays having different M/N combinations to allow failure data collection corresponding to different failure rate ranges; and
    stressing the metal lines and assuming a failure when a single metal line fails, wherein the stressing includes stressing each array separately and detecting electromigration failure using four-point probe resistance measurements.

9. The method of claim 8, further comprising converting cumulative distribution function (CDF) values of each array to a corresponding CDF value of a single metal line.

10. The method of claim 8, further comprising fitting the CDF values and failure times of the array to a failure distribution to determine the statistical parameters of a single metal line.

11. The method of claim 8, wherein a failure distribution is a lognormal failure distribution.

12. The method of claim 8, wherein the providing includes using a dual damascene process.

13. The method of claim 8, wherein the providing includes providing the array with N number of metal lines wired in the serial configuration in each multilink test set and M number of the multilink test sets connected in the parallel configuration.

14. A test structure for electromigration analysis, the test structure comprising:
    a plurality of arrays, each array including a plurality of multilink test sets, each multilink test set including a plurality of metal lines positioned within a dielectric material and connected in a serial configuration;
    each multilink test set being connected in a parallel configuration with the other multilink test sets, the parallel configuration including a first electrical connection to a cathode end of a first metal line in each multilink test set and a second electrical connection to an anode end of a last metal line in each multilink test set; and
    each array including N number of metal lines wired in the serial configuration in each multilink test set and M number of the multilink test sets connected in the parallel configuration, each array having a different M/N combination to allow failure data collection corresponding to different failure rate ranges.

15. The test structure of claim 14, wherein for each M/N combination has N in the range 1 to 1000 and M in the range 1 to 1000.

* * * * *